United States Patent [19]

Arenson

[11] Patent Number: 4,563,649
[45] Date of Patent: Jan. 7, 1986

[54] CATHODE RAY TUBE TRACKING TESTER AND METHOD OF TESTING

[75] Inventor: Barry A. Arenson, Sioux Falls, S. Dak.

[73] Assignee: Sencore, Inc., Sioux Falls, S. Dak.

[21] Appl. No.: 512,177

[22] Filed: Jul. 11, 1983

[51] Int. Cl.⁴ .................. G01R 31/24; H04N 9/20
[52] U.S. Cl. ................................................ 324/404
[58] Field of Search ............... 324/404, 403; 445/3, 445/63; 315/383; 358/10

[56] References Cited

U.S. PATENT DOCUMENTS 3,688,184 8/1972 Baum ............................... 324/404
4,101,823 7/1978 Farmer ........................... 324/404

Primary Examiner—Stewart J. Levy
Assistant Examiner—Robert R. Raevis
Attorney, Agent, or Firm—Edmond T. Patnaude

[57] ABSTRACT

Tracking of the electron guns of a multiple-gun cathode ray tube system is tested by individually testing the emission current of each gun, storing voltages proportional to the emission currents of each gun and subsequently selecting the highest voltage stored and comparing it to each of the stored voltages.

7 Claims, 1 Drawing Figure

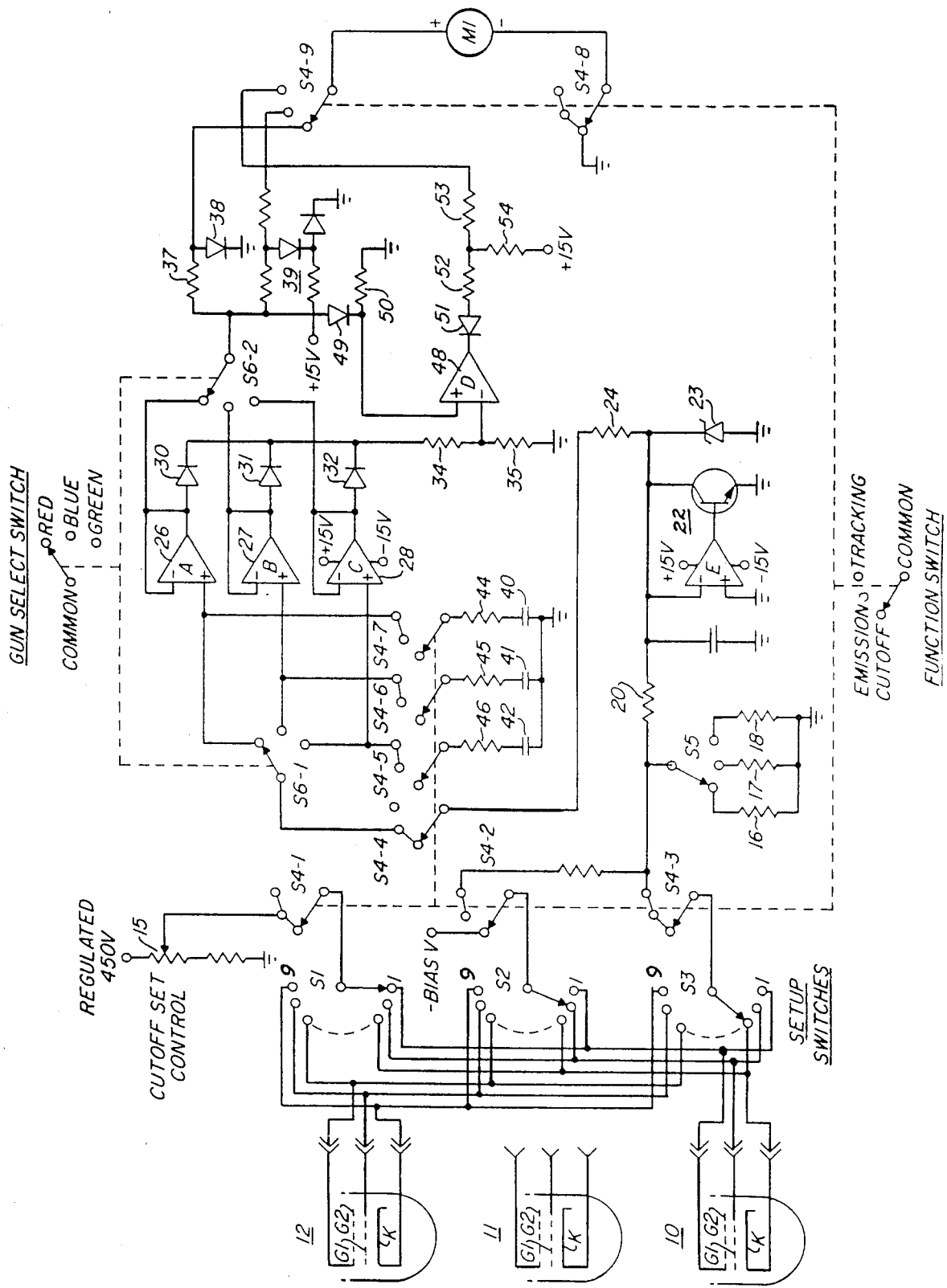

CATHODE RAY TUBE TRACKING TESTER AND METHOD OF TESTING

The present invention relates in general to the art of testing the tracking characteristics of the electron guns of a multiple-gun cathode ray tube system, and it relates in particular to a new and improved method and circuit for determining if the tracking characteristics are unacceptable and if so, which particular gun is defective.

BACKGROUND OF THE INVENTION

In order to provide a satisfactory visual display on the screen of a cathode ray tube system which utilizes a plurality of electron guns, it is necessary that all of the guns have similar characteristics, and in particular that the emission currents from the several guns not vary by an appreciable amount from each other under normal operating conditions. The electron emission from the individual guns are tested by what is known as an emission test in which each gun or tube is individually biased near cutoff and then the bias on all guns or tubes is reduced by an identical amount resulting in a substantial amount of emission current from each gun or tube. For proper tracking, manufactures recommend that the ratio of the emission current from the highest current gun to the lowest current gun not exceed 1.5 to 1. Experience also shows that any ratio greater than 1.5 to 1 results in unacceptably poor tracking and poor picture reproduction.

In patent 3,688,184—Baum there is described a method and circuit for determining if a multiple-gun cathode ray system has satisfactory tracking characteristics. It would be desirable, however, to determine which of the guns has an unacceptably low cathode emission in those cases where the tracking characteristics of the system are unsatisfactory.

SUMMARY OF THE INVENTION

Briefly, there is provided in accordance with the present invention a new and improved tracking test and electron gun tester wherein an emission test is performed on each of the electron guns under the same operating conditions in a given system, and as each such test is made a voltage proportional to the respective emission current is developed and stored. Then after completion of the emission tests on all of the electron guns, each of the stored voltages is selectively compared to the maximum stored voltage, and if in any case the difference exceeds a predetermined amount, the tester indicates that the corresponding electron gun is defective.

GENERAL DESCRIPTION OF THE DRAWING

The present invention will be better understood by a reading of the following detailed description taken in connection with the accompanying drawing wherein:

The single FIGURE is a schematic diagram of a circuit for testing the tracking characteristics of a multiple-gun cathode ray tube system.

DETAILED DESCRIPTION OF A PREFERRED EMBODIMENT OF THE INVENTION

Referring to the drawing there are shown three individual electron guns 10, 11 and 12 respectively including a cathode K, a control grid G1 and a screen grid G2. The guns 10, 11 and 12 may be incorporated in a single, multiple-gun cathode ray tube, or they may be the individual guns in the three single-gun cathode ray tubes of a multiple tube display system. The method and test circuit of the present invention may be used to test the tracking characteristics of the electron guns of either type of system.

When testing the operation of the electron guns of a multi-gun cathode ray tube the standard practice is to apply a high negative bias on the control grid G1, adjust the screen grid bias to a value where the emission currents are minimal, and then remove the control grid bias and measure the individual cathode currents. If the high voltage anode, and remaining high voltage elements are not energized during this test, a resistor may be inserted in series with the cathode. The voltage which is developed across this resistor by the current emitted by the cathode is proportional to the magnitude of the emission current.

In order to perform the emission test on the electron guns of a multiple-gun system using the test circuit and method of the present invention, the socket or sockets of the cathode ray tube or tubes to be tested are connected to the test circuit by means of a suitable plug connector or connectors which connect the elements of the electron guns to the contacts of three gun set-up switches S1, S2 and S3; and the cathode K of the gun 10 is connected to the third contacts of the of the switches S1, S2 and S3. Similarly, the corresponding elements of the green gun 11 are connected to the fourth, fifth and sixth contacts of the switches S1, S2 and S3 with the corresponding elements of the blue gun 12 being connected to the seventh, eighth and ninth contacts of these same set-up switches.

In order to enable the use of the test circuit to make the three step cathode emission and tracking test described above, there is provided a three position, rotary function select switch S4. As shown, the first wafer is identified as S4-1, the second wafer as S4-2 and so forth through S4-9, and the nine wipers are ganged together.

The Wafer S4-1 is used to connect the screen grid G2 of the gun under test to a regulated source of d.c. votage for biasing the gun to cut off while a high negative voltage is applied to the associated control grid G1 via the wafer S4-2. It may be seen that the wiper of the switch S1 is thus directly connected to the wiper of the switch wafer S4-1 and the wiper of the switch S2 is directly connected to the wiper of the switch wafer S4-2. Also, the wiper of the switch S3 is directly connected to the wiper of the switch wafer S4-3.

In the drawing the set-up switches S1, S2 and S3 are shown in the positions to test the electron gun 10, i.e., to connect the screen grid, control grid and cathode of the red gun 10 to the respective wipers S4-1, S4-2 and S4-3 of the function select switches S4, which switch is shown in the cut off position. When testing a gun, the positive bias voltage applied via the switch wafer S4-1 is adjusted by means of a potentiometer 15 connected between the regulated power supply and ground so that the cathode current is minimal. The technician performing the test can observe the cathode emission current on a meter M1.

The wiper of the switch wafer S4-3 is connected to the wiper of a selector switch S5 having three contacts respectively connected to ground through resistors 16, 17 and 18. It may be seen that the selected one of the resistors 16, 17 and 18 will then be connected in series with the cathode K of the gun under test and the particular resistor selected depends on the design of the particular gun. One of these resistors 16 has a value for use with a normal video tube, another, 17, for use with a projection tube and the third, 18, for use with a scope. The voltage developed across the selected resistor and appearing on the wiper of the switch S5 will thus be proportional to the cathode emission current of the gun under test. This voltage is coupled through a resistor 20 and a filter circuit 22 which converts the input voltage which can be either above or below zero volts to a voltage which is between 0 and +15 volts D.C. A ZENER diode 23 provides added protection for the circuit components following the filter to which the filtered voltage is applied through S4-4 and the wafer S6-1 of a gun select, rotary switch S6.

As shown, the switch S6 has three contact positions on two switch wafers, the respective wipers being ganged together. The upper contact position is labeled red, the middle contact position is labeled green, and the lower contact position is labeled blue. The switch S6 is illustrated in the red gun test position corresponding to the illustrated position of the switches S1, S2 and S3 connecting the elements of the red gun 10 to the test circuit.

The contacts of switch wafer S6-1 are respectively connected to the second and third contacts of the junction switch wafers S4-5, S4-6, and S4-7 and to the positive inputs of high impedance, buffer, bi-fet operational amplifiers 26, 27 and 28. The outputs of the operational amplifiers 26, 27 and 28 are each connected to ground through a respective one of a plurality of diodes 30, 31 and 32 and a voltage divider consisting of a pair of series connected resistors 34 and 35. The outputs of the operational amplifiers are also directly connected to respective ones of the contacts on switch wafer S6-2. The wiper of the switch wafer S6-2 couples this output voltage through a meter dampening circuit including a resistor 37 and a diode 38 to one contact on the switch wafer S4-9 and thus across the meter M1.

With the switches set in the illustrated positions, the potentiometer 15 is adjusted to provide a minimal reading on the meter M1. The switch S4 is then rotated to the second switch position, i.e., the emission current test position. In this position the control grid is disconnected by the switch wafer S4-2 from the source of negative bias voltage wherefor the cathode becomes conductive and the voltage developed across the selected one of the resistors 16, 17 and 18 is coupled through the second contact of the switch wafer S4-4 to the meter M1 via a different meter damping circuit 39 and the second contact of the switch wafer S4-9 circuit. The emission current of the red gun thus appears on the meter M1.

When the switch S4 is in the second switch position, i.e., the emission current test position, the voltage developed across the selected one of the resistors 16, 17 and 18 is coupled through one of the switch wafers S4-5, S4-6 and S4-7 to one of three storage capacitors 40, 41 and 42 depending upon the particular gun being tested. It may be seen that the capacitor 40 is connected in series with a resistor 44 between ground and the wiper of the switch wafer 24-7 and thus stores a voltage proportional to the emission current from the red gun. The capacitors 41 and 42 are similarly connected to the wipers of the switches S4-6 and S4-5 by resistors 45 and 46 and thus store voltages corresponding to the green and blue guns respectively.

Upon completion of the emission test for the red gun 10, the function select switch is returned to the first switch position, the gun select switch S6 is set to the green gun position and the switches S1, S2 and S3 are set to connect the cathode, control grid and screen grid of the green gun into the test circuit. The patentiometer 15 is then adjusted to the cut-off position and then the switch S4 is rotated to the emission test position so that the emission current of the green gun under test is displayed in the meter M1. During the emission test the voltage corresponding to the green gun emission is stored across the capacitor 41. The switch S4 is then reset to the first switch position and the switch S6 is set to the blue gun select position and the test procedure is repeated.

Once the cutoff set up and emission portions of the test have been completed for all three guns, the overall tracking test can be performed by simply rotating the function select switch to the third switch position, i.e., the tracking test position. In this position the wiper of the switch wafer S4-4 is disconnected from the portions of the circuit preceding it and only the voltages stored across the capacitors 40, 41 and 42 are applied to the positive inputs of the respective operational amplifiers 26, 27 and 28 and the voltage appearing at the junction of the diodes 30, 31 and 32 will be slightly less, about 0.6 volts, than the highest of the three voltages at the outputs of the amplifiers 26, 27 and 28. The resistance values of the resistors 34 and 35 are selected so that the voltage developed across the resistor 35 is two-thirds of the voltage applied across the resistors 34 and 35, i.e., about one and one-half times less than the highest output voltage from the amplifiers 26, 27 and 28. This voltage is applied to the negative or inverting input of an operational amplifier 48. The positive or non-inverting input of the amplifier 48 is connected by a diode 49 to the wiper of the switch wafer S6-2 and a resistor 50 is connected between ground and the junction between the diode 49 and the amplifier 48. Those skilled in the art will recognize that the amplifier 48 functions as a comparitor and its output will go low if the voltage at the wiper of switch wafer S6-2 is less than the voltage across the resistor 35. The output of the amplifier is coupled to the third or tracking test contact of the switch wafer S4-9 by a circuit including a diode 51, and a pair of series connected resistors 52 and 53. The junction between the resistors 52 and 53 is connected by a resistor 54 to a source of positive voltage which biases the diode 51 to the on condition only when the output of the amplifier 48 is low. Consequently, with the switch S4 in the tracking test position the meter M1 will read zero unless the output of the amplifier 48 is low.

While the switch S4 is in the tracking test position, the gun select switch S6 is moved by the technician to each of its three positions while observing the meter M1. If the emission from any one gun is no more than one and one-half times as great as that of any other gun the meter M1 will read zero when the switch S6 is in all three of its positions. Where, however, there is u:acceptable tracking, the meter will indicate that one of the guns has an emission current which is less than two-thirds of that of the maximum emission current from all three of the guns. Moreover, when the meter M1 indicates that the tracking is unacceptable, the position of the gun select switch will at that time show which of the three guns is defective.

It should be understood that should industry standards change the test circuit of the present invention may be used to indicate other acceptable maximum spreads between the emission currents from the guns in a given system simply by changing the relative values of the resistors 34 and 35.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. A method of determining the tracking characteristics of a multiple cathode ray gun system and of identifying which, if any, of the cathode ray guns has less than an acceptable cathode emission current, comprising the steps of selectively measuring the cathode emission currents of each of said guns under the same operating conditions, storing voltages proportional to the cathode emission currents of each of said guns, then selecting the maximum one of said voltages, selectively comparing the maximum one of said voltages to each of said voltages, and providing for each of said voltages an indication of whether that voltage differs from the maximum one of said voltages by more or less than a predetermined percentage.

2. A method according to claim 1 including the steps of dividing the maximum one of said voltages by a predetermined factor to provide a reference voltage level, and said step of selectively comparing is carried out by comparing said reference voltage level to each of said voltages.

3. A method according to claim 2 wherein said predetermined factor is 1.5.

4. A method according to claim 1 wherein said step of selectively comparing is carried out by connecting said maximum one of said voltages to one input of a comparitor, and manually switching each of said voltages to another input of said comparitor.

5. A tracking tester for testing the electron guns of a multiple gun cathode ray tube system, comprising means for setting the bias voltages on said guns to selectively measure the emission currents therefrom, means for developing voltages proportional to said emission currents and for storing said voltages, means for selecting the maximum one of said voltages, comparitor means having first and second inputs and an output, meter means connected to said output, means for connecting only the maximum one of said stored voltages to said first input of said comparitor means, and switch means for selectively switching said proportional to said emission currents to said second input of said comparitor means.

6. A tracking tester according to claim 5 wherein said means for setting comprises, three selector switches each having a plurality of contacts adapted to be connected to inputs to the electron guns under test, and each having a wiper, one of said wipers being connected to a source of adjustable, positive d.c. voltage, another of said wipers being connected to a source of negative d.c. voltage, and a meter means connected to the third of said wipers for providing a visual display of the current flowing through said third wiper.

7. A tracking tester according to claim 6 comprising first, second and third voltage storage capacitors, and manually operable selector switch means for selectively connecting said capacitors to said third wiper.

* * * * *

UNITED STATES PATENT AND TRADEMARK OFFICE
CERTIFICATE OF CORRECTION

PATENT NO. : 4,563,649
DATED : January 7, 1986
INVENTOR(S) : Barry A. Arneson

It is certified that error appears in the above—identified patent and that said Letters Patent is hereby corrected as shown below:

Column 6, line 20, after "said" insert -voltages-.

Correct the spelling of the surname of the inventor to -Arneson-.

Signed and Sealed this

Twenty-second Day of April 1986

[SEAL]

Attest:

DONALD J. QUIGG

Attesting Officer   Commissioner of Patents and Trademarks